(12) United States Patent
Ishizaki et al.

(10) Patent No.: US 6,649,986 B1
(45) Date of Patent: Nov. 18, 2003

(54) SEMICONDUCTOR DEVICE WITH STRUCTURE FOR DIE OR DICE CRACK DETECTION

(75) Inventors: Takashi Ishizaki, Tokyo (JP); Takashi Tamaki, Tokyo (JP)

(73) Assignee: Oki Electric Industry Co, Ltd., Tokyo (JP)

(*) Notice: Subject to any disclaimer, the term of this patent is extended or adjusted under 35 U.S.C. 154(b) by 0 days.

(21) Appl. No.: 10/172,971

(22) Filed: Jun. 18, 2002

(51) Int. Cl.[7] ............................................. H01L 29/84
(52) U.S. Cl. ................................... 257/415; 257/414
(58) Field of Search ............................. 257/414, 415

(56) References Cited

U.S. PATENT DOCUMENTS 5,723,875 A * 3/1998 Abe et al. ..................... 257/48

6,449,748 B1 * 9/2002 Jeng et al. ..................... 716/4

FOREIGN PATENT DOCUMENTS

| JP | 06077300 A | * | 3/1994 | ........... H01L/21/66 |
| JP | 08139057 A | | 5/1996 | |
| JP | 2001066319 A | * | 3/2001 | ........... G01P/15/12 |

* cited by examiner

Primary Examiner—Allan R. Wilson
(74) Attorney, Agent, or Firm—Rabin & Berdo, P.C.

(57) ABSTRACT

To provide a semiconductor device that has a structure for detecting dice cracks that occur in semiconductor chips. The semiconductor device structure according to the present invention makes it possible to detect electrically only the dice cracks that cause a loss of functionality of the semiconductor chip, doing so at the same time as the electrical characteristic tests that are performed after the fabrication of the semiconductor device.

9 Claims, 4 Drawing Sheets

SEMICONDUCTOR DEVICE WITH STRUCTURE FOR DIE OR DICE CRACK DETECTION

BACKGROUND OF THE INVENTION

1. Field of the Invention

The present invention relates to semiconductor devices, and more particularly relates to semiconductor devices that include structures for detecting die or dice cracks that occur in semiconductor chips when dicing the wafer to produce semiconductor chips.

2. Description of Related Art

In the semiconductor chip manufacturing process several tens of and several hundreds of semiconductor chip sections having formed therein active element regions are formed in and on a single wafer. Consequently, the wafer is divided into individual semiconductor chips through the performance of the dicing process. Specifically, dicing grooves are formed along dicing lines that are appropriately established on the wafer surface, doing so through a scribing method, a laser method, or a dicing saw method. Afterwards, the wafer is separated into individual semiconductor chips by breaking it along the dicing grooves that have been formed.

Conventionally, the semiconductor chips wherein dice cracks have occurred in the dicing process have been sorted out through visual inspections.

SUMMARY OF THE INVENTION

The object of the present invention is to provide a semiconductor device that has a structure for the electrical detection of dice cracks.

Specifically, the dice cracks in the dicing process that would cause a loss of functionality of the semiconductor chip and that occur on the edges or in the middle of the semiconductor chip are detected by measuring changes in impedance depending on whether or not there are disconnects in detection interconnections and/or detection diffusion layers that are connected between monitor terminals in order to separate out the defective semiconductor chips or the defective semiconductor dice.

The semiconductor chip structure of the present invention makes it possible to detect electrically defects due to dice cracks at the same time as the electrical characteristic tests that are performed after the assembly of the semiconductor devices. The separating out of the semiconductor chips can be done with more consistency and with more certainty, and can be performed more easily. The visual inspection process can be eliminated. As a result, it is possible to reduce the number of inspectors and shorten the inspection process, making it possible to reduce the cost of the product substantially.

BRIEF DESCRIPTION OF THE DRAWINGS

The foregoing and other objects, features, and advantages of the present invention will be better understood from the following description taken in connection with the accompanying drawings, in which.

DESCRIPTION OF THE PREFERED) EMBODIMENTS

Figure 1A:
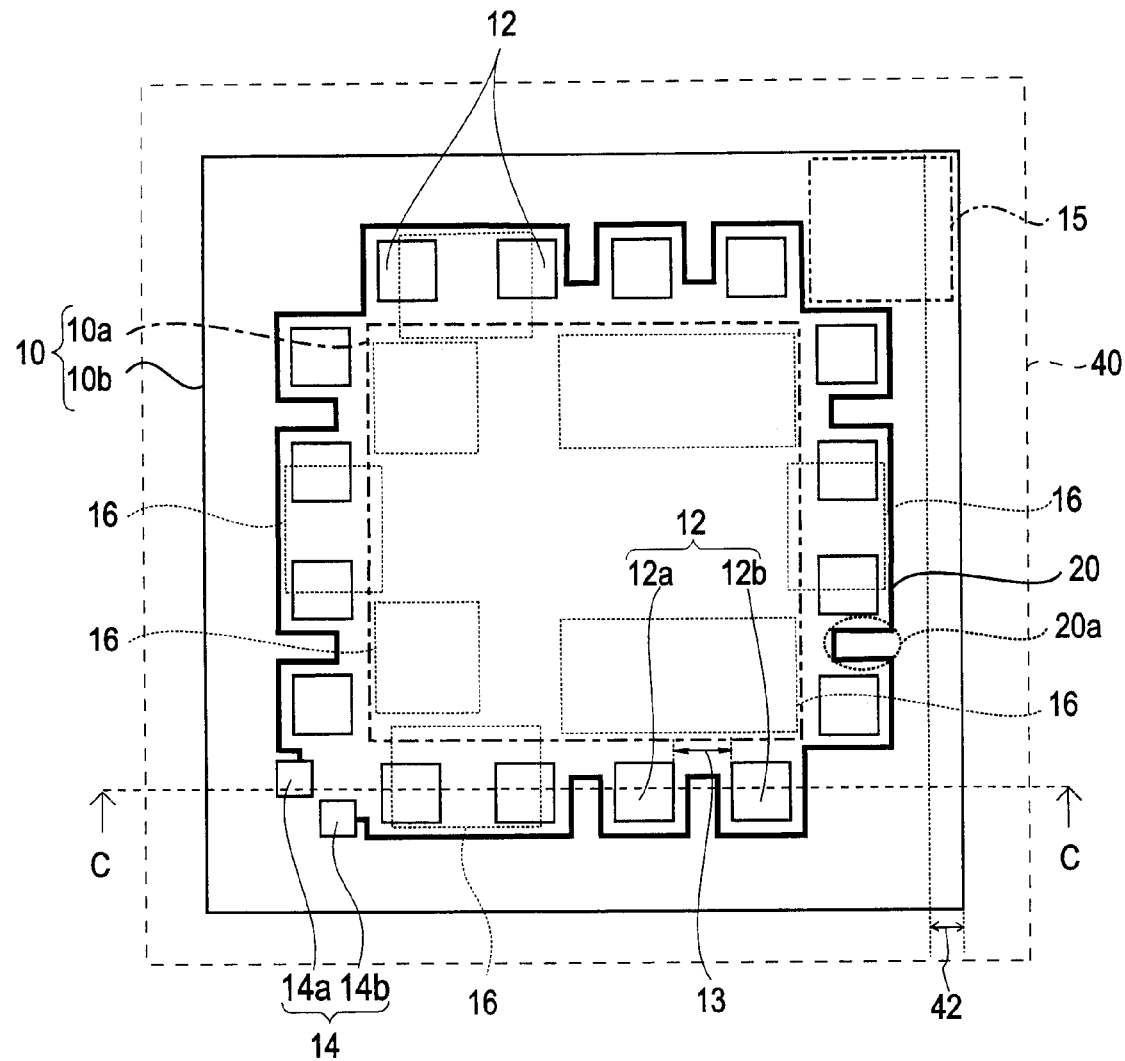
FIG. 1A and FIG. 1B are a schematic top view of a semiconductor device equipped with a dice crack detection interconnection in a first embodiment of the present invention and a schematic cross-sectional drawing showing a cross-section along the dotted line C—C.

Examples of embodiments of the present invention will be described below, referencing the drawings. Note that the various drawings do nothing more than represent schematically the shapes, sizes, and relative positioning of the various constituent elements to facilitate understanding of the present invention. Consequently, the structure of the present invention is not limited to the examples in the drawings. In addition, note that elements having identical functions in all of the drawings are indicated by identical codes, and thus repetitive explanations have been omitted.

First Embodiment

The structure of a semiconductor device according to the present invention will be explained in connection with FIG. 1A and FIG. 1B.

Figure 1B:
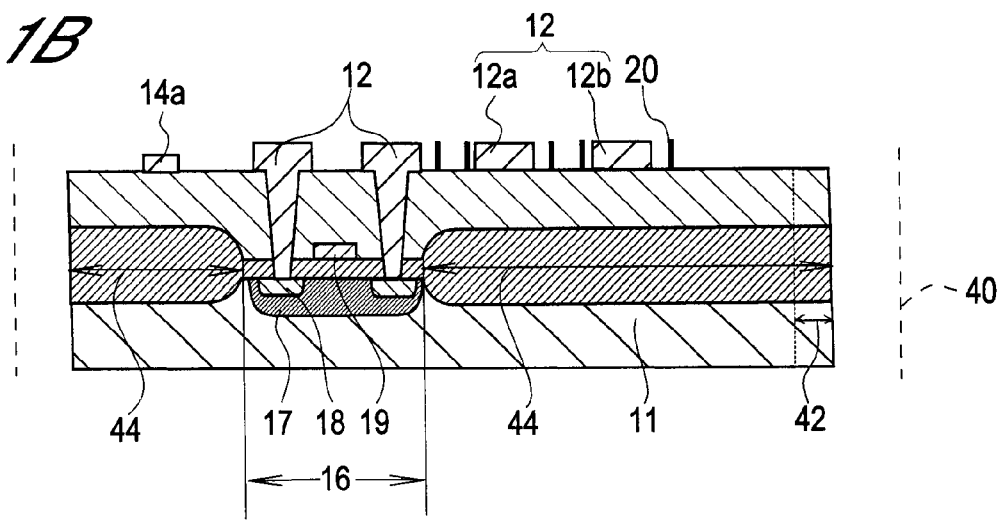

FIG. 1A and FIG. 1B are a top planar view showing schematically the structure of a semiconductor device according to the first example of embodiment, and a schematic cross-sectional diagram showing a cross section along the dotted line C—C.

The semiconductor chip 10 according to the first example of the present invention comprises two regions: a central region 10a and a peripheral region 10b. In other words, in the figure, the region to the inside surrounded by a single dotted dashed line is the central region 10a, and the region outside to the edge is the peripheral region 10b. The peripheral region 10b of the semiconductor chip 10 is equipped with multiple electrode pads 12, and a die or dice crack detection interconnection 20, both of the pads 12 and the interconnection encircling the central regions 10a.

The multiple electrode pads 12 are arranged along the edges of the individual semiconductor chips 10, separated from each other. The semiconductor chips 10 have multiple regions where at least one element is formed. The regions 16 are called element regions. In FIG. 1A the schematic layout of the multiple element regions 16 within the semiconductor chip 10 are indicated by the dotted lines. The shapes and arrangement of the element regions 16 are determined by the design.

For ease in the explanation, the explanation will omit explanations of several of the element regions 16. The element burgeons 16 have a transistor element formed therein. The element regions 16 are also termed "active regions." The element regions 16 are equipped with a first diffusion layer 17 as a well region, a second diffusion layer 18 as a source and drain for MOS transistors, and a gate 19.

The region containing the first diffusion layer 17, the second diffusion layer 18, and the gate 19, fabricated in the element region 16, is essentially tied to the functions of the semiconductor chip Semiconductor chip defects due to dice cracks occur by cracks extending to the electrode pads (metal interconnection layer) 12 and/or the element region 16 within the inner chip part of the semiconductor chip 10.

When there are multiple semiconductor chips 10 fabricated on a wafer and then divided by a dicing process, the dicing lines 40 are generally established at a location approximately 70 μm distant from the outer edge of the semiconductor chip. In other words, the gap between two adjacent semiconductor chips is set at approximately 140 μm. The semiconductor chips 10 that are broken apart in the dicing process are surrounded by a passive dicing margin region 42 that is 30 μm to 40 μm wide, wherein there are fabricated no elements such as transistors. Additionally, in the inner portion of the semiconductor chip 10, there are also buffer or passive regions wherein elements are not fabricated. The passive region that includes this dicing margin region 42 is also called the "field region" or "isolation region." A thick field oxide layer is fabricated in this field region 44. This is a separating region that separates from each other adjacent elements such as multiple transistors.

In other words, the field region 44 exists so as to encompass the element regions 16 or the active regions.

Consequently, the regions that are defined by this field region 44, or in other the regions aside from the field region 44 that are determined by the field region 44, can also be said to be the active regions.

When there is a crack in a field region 44 that includes a dicing margin region 42 that exists in the edge of a semiconductor chip 10, it does not have an impact on the function itself of the semiconductor chip 10.

Consequently, a dice crack detection interconnection 20 is fabricated as a single continuous interconnection so as to encompass the region wherein the multiple element regions 16 and electrode pads 12 relating to the functions of the semiconductor chip 10 are fabricated. Both ends of the dice crack detection interconnections 20 are individually connected independently to detection terminals that are adjacent to each other, or in other words, to a first detection terminal pad 14a and a second detection terminal pad 14b. The dice crack detection interconnections 20 are preferably fabricated in the vicinity of the boundary lines (surfaces) of the element regions 16 above the field region 44, or in other words on the top side of the field oxide layer, when the semiconductor chip 10 is viewed from the top side in an planar view.

In the constructional example shown in FIG. 1A and FIG. 1B, the chip corner region 15, the dicing margin region 42 and the region of the gap 13 between the adjacent first electrode pad 12a and second electrode pad 12b, all exist in the range of the field region 44 when viewed in a planar fashion from above the semiconductor chip.

Consequently, the dice crack detection interconnection 20 is provided not to detect cracks that occur in the field region 44. Specifically, the interconnection 20 is formed above the field region 44 and in the vicinity of the boundary line between the element region 16, or the active region, and the field region 44. In other words, the interconnection 20 is formed on the chip 10 at an inside position which is remote from the peripheral edge 10b of the chip 10 as much as possible. For example, the interconnection 20 has straight portions and not-straight portions. The not-straight portions include bent portions, crooked portions and/or meander portions. A first part 20a corresponds to one of the bent portions and is equipped by causing there to be bends as appropriate in the dice crack detection interconnection 20, in order to include as much as possible of the region in the range of the field region 44, when viewed in a planar fashion from above the top surface of the semiconductor chip 10 when looking from the edge of the semiconductor chip 10 towards the center. The first part 20a has a pair of parallel portions that are mutually facing the multiple electrode pads 12 and a bridging portion connecting between the parallel portions.

In other words, it is preferable to fabricate the dice crack detection interconnection 20 in the vicinity of the boundary line above the field region 44 with the element region 16, or in other words, the active region, and, preferably following the edge of the electrode pads 12 when viewed in a planar fashion from above the semiconductor chip It is preferable for the dice crack detection interconnection to be fabricated from a metal interconnection.

It is preferable for the dice crack detection interconnection 20 to be fabricated in the same layer as the electrode pads (metal interconnection layer) 12.

Both ends of the dice crack detection interconnection 20 are preferably connected to a pair of detection electrodes closing each other, respectively, in other words, to a first detection electrode pad 14a and a second detection electrode pad 14b, closing each other, respectively, through a contact, if necessary. In other words, the distance between these two end parts will be as short as possible. This means that one of the ends of the dice crack detection interconnection 20, which is fabricated as a single continuing interconnection, will be as close as possible to the other end.

In the embodiment of the present invention shown in FIGS. 1A and 1B, the pair of detection terminals is arranged in the corner region 15 of the semiconductor chip 10; however, the positioning of the detection terminals is not limited to this example, and can be modified as appropriate according to the specifications, etc., of the semiconductor chip 10.

Of the semiconductor chips that were defined as defective in the physical-shape-based semiconductor chip sorting using visual inspections using, for example, microscopes, as has been performed conventionally, there have been included chips that would function electrically without problems because of the position where the dice cracks exist. The structure in the first embodiment makes it possible to save those semiconductor chips that are functionally non-defective, which, conventionally, have been separated out as defective semiconductor chips based on external appearances only despite their functioning normally.

A detailed explanation of the manufacturing process for the semiconductor chip 10 in this embodiment will be omitted because it is the same as the interconnection fabrication process used in a conventional semiconductor chip manufacturing process.

The dice crack detection interconnection 20 according to the present invention can be fabricated through performing, for example, masking processes and etching processes following normal methods, performed at the same time as fabricating the metal interconnection layer (electrode pads) 12.

Even when fabricating the dice crack detection interconnection 20 in the inner portions of the semiconductor chip, normal methods can be used, for example, during the process for fabricating the interlayer isolation layers.

In all of the embodiments of the present invention, the materials that are used in the dice crack detection interconnections 20 are, for example, metals such as aluminum or copper. However, selections of materials can be made as appropriate depending on the specifications of the applicable semiconductor chip, and are not particularly constrained.

The dice crack detection interconnections 20 may also be fabricated from polysilicon interconnects using common methods.

Although there are no particular constraints on the interconnection line thickness of the dice crack detection interconnections 20, in order to detect accurately the occurrence of cracks that will cause a loss of functionality in the semiconductor chip 10, and in order to increase the yield, it is preferable that the minimum interconnection line width follow the minimal semiconductor chip manufacturing process rules that can be implemented. In addition, from the perspective of manufacturing efficiency, it is preferable for the interconnection line widths of the dice crack detection interconnections 20 to be the same as the manufacturing process rule for the semiconductor chip 10.

The gap between the dice crack detection interconnections 20 equipped above the field region 44, and the element region 16, when viewed in a planar fashion from the top surface side of the semiconductor chip 10, depends on the manufacturing process rule. In other words, "the vicinity of the boundary line" refers to the region on the side of the field region 44 that is near to the boundary line (surface) between the field region 44 and the element region 16, preferably in the minimal gap that is established following the aforementioned manufacturing process rule.

The dice crack detection interconnections 20 and/or dice crack detection diffusion layer 30 in all of the embodiments of the present invention are explained as a single layer of interconnections or diffusion layers; however, the interconnections can also be fabricated as interconnections and/or diffusion layers that are, for example, two lines, three lines, or more in the same plane.

In such cases, it is possible to detect dice cracks that break only the outside interconnection lines and/or diffusion layers, which is particularly useful when it is necessary to detect dice cracks with precision.

In all of the examples of embodiment of the present invention, a single-layer interconnection has been used in order to simplify the explanation; however, it is of course possible to apply multilayer interconnections to the semiconductor chip as well.

The dice crack detection interconnections according to the present invention were explained as a single continuous structure existing within a single plane; however, they are not so constrained, and in, for example, a semiconductor device with multilayer interconnections, the interconnections can be fabricated as a continuous structure wherein multiple segmented dice crack detection interconnections provided in the respective interconnection layers are connected to each other, or the like.

The semiconductor chip 10 according to the present invention, manufactured as described above, can comprise a semiconductor device that has the desired functions and the dice crack monitor function of the present invention by being bonded to a semiconductor substrate and/or to another semiconductor chip.

When detecting dice cracks in the semiconductor chip 10 according to the first example of embodiment, it is possible to use a tester that is used in conventional electrical characteristic testing after assembly into semiconductor devices. From the perspective of reducing manufacturing costs, it is preferable to perform the dice crack detection in parallel to electrical characteristic testing that has been performed conventionally, such as durability testing, temperature characteristic testing, and accelerated aging testing.

Specifically, in addition to the aforementioned electrical characteristic tests that are usually performed, by adding a program to measure the impedance between the detection terminals, or in other words, between the first detection electrode pad 14a and the second detection electrode pad 14b, it is possible to detect the occurrence of dice cracks that will cause a loss of functionality in the semiconductor chip, or in other words, to detect a break in the dice crack detection interconnection 20, to thereby sort out the defective semiconductor devices.

The semiconductor chip structure according to the present invention makes it possible to test electrically and with high efficiency for defects due to dice cracking at the same time that the electrical characteristic tests are performed after semiconductor device assembly.

The semiconductor chip structure according to the present invention makes it possible to perform semiconductor chip sorting with more consistency and more certainty, doing so more easily.

Additionally, this semiconductor chips structure makes it possible to eliminate the visual inspection process. As a result, it is possible to reduce the number of inspectors and shorten the inspection process, thus greatly reducing the cost of the product.

It is possible also to measure the impedance between the first detection electrode pad 14a and 14b immediately after the semiconductor chip 10 is divided out in the dicing process, or in other words, prior to the semiconductor device assembly.

The "dicing process," as stated in the present invention, is not particularly constrained, but rather it includes, for example, the scribing method, the laser method, the dicing saw method, and the like. All embodiments of the present invention can be applied to semiconductor chips that have been separated out by passing through these dicing processes, and to the semiconductor devices created by assembling the same.

All embodiments of the present invention are essentially independent of the form of packaging of the semiconductor device; however, it is, of course, self-evident that appropriate changes can be made in the layouts of the dice crack detection interconnections and/or the dice crack detection diffusion layer (described below) according to the present invention, to the means for testing the impedance thereof, or the like, depending on, for example, design changes in the form of packaging, or the like.

Second Embodiment

A semiconductor chip structure according to a second embodiment will be explained below in relation to FIG. 2A and FIG. 2B.

Figure 2A:
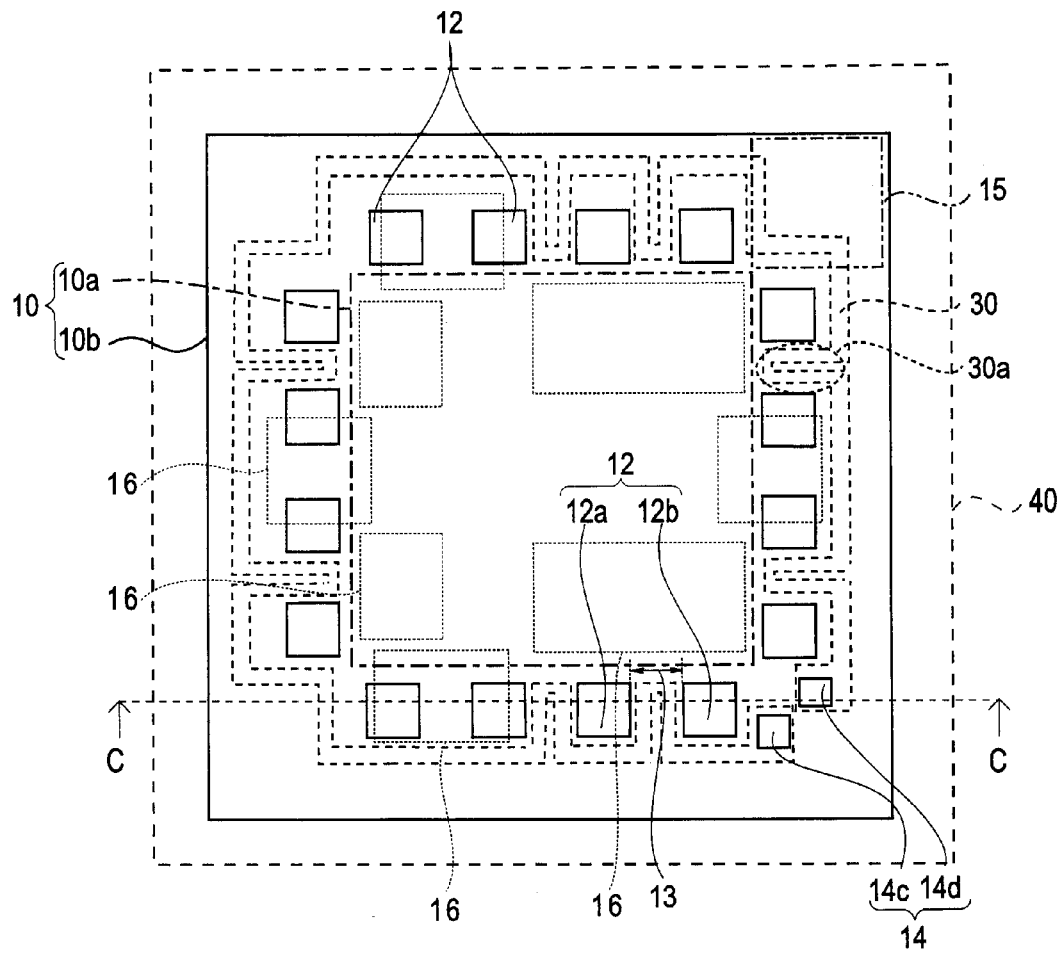
FIG. 2A and FIG. 2B are a schematic top view of a semiconductor device equipped with a dice crack detection diffusion layer in a second embodiment of the present invention, and a schematic cross-sectional drawing showing a cross-section along the dotted line C—C.

FIG. 2A is drawing that shows schematically the structure of a semiconductor chip according to the second embodiment.

A semiconductor chip 10 according to the second embodiment of the present invention is equipped with a dice crack detection diffusion layer 30 as the dice crack detection interconnection. When it comes to the dice crack detection diffusion layer 30, a dice crack detection diffusion layer 30 of a type that is different from the conductor type of the semiconductor substrate 11 used is created through the ion implantation method. Specifically, if, for example, the semiconductor substrate 11 is N type, then boron (B) could be used as the ion, or if the semiconductor substrate 11 is P type, then arsenic (As) could be used as the ion, in fabricating the dice crack detection diffusion layer 30.

In addition, both end parts of the dice crack detection diffusion layer 30 are connected to a pair of mutually differing detection terminals for detecting dice cracks, or in other words, to a third detection electrode pad 14c and a fourth detection electrode pad 14d.

As was the case for the dice crack detection interconnection 10 in the first embodiment, preferably both ends of the dice crack detection diffusion layer 30 are connected to a pair of monitor or detection terminals (contacts) so that the opening formed will have as small a gap as is possible.

Figure 2B:
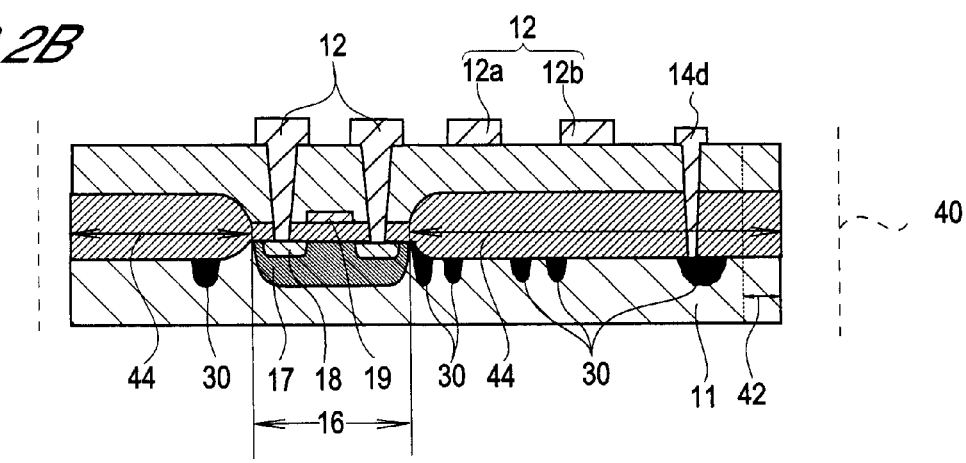

FIG. 2B is a schematic cross-sectional diagram showing a cross section along the broken line C—C in the semiconductor chip 10 in FIG. 2A.

While the semiconductor chip 10 in the first embodiment is to detect dice cracks that occur on, and extend from, the top surface side of the semiconductor chip 10, the second embodiment is to detect dice cracks that occur on, and extend from, primarily the bottom surface side of the semiconductor chip 10, or in other words, from the bottom side surface of the semiconductor substrate 11.

Similar to the first embodiment, the dice crack detection diffusion layer 30 in the second embodiment is preferably formed in a region that does not effect the functionality of the semiconductor chip 10, or in other words, is under the field region 44 in the vicinity of the boundary surface with the element region 16 or the active region. The field region 44 is a section wherein the existence of dice cracks are allowable from the perspective of functionality, and the element region 16 is a section wherein the existence of dice cracks is not allowable. Specifically, this dice crack detection diffusion layer 30 is preferably provided on the bottom surface of the field region 44. In other words, the layer 30 may be formed in the semiconductor substrate 11 region beneath the field oxide layer.

Similar to the first embodiment, the dice crack detection diffusion layer 30 is preferably provided with a second part 30a that is bent as appropriate so that the active area encompassed by the dice crack detection diffusion layer 30 will be as small as possible. In other words, the dice crack detection diffusion layer 30 is preferably fabricated so that, when viewed from the top surface of the semiconductor chip 10 in a planar manner, it follows the edges of the electrode pads or passes under the electrode pads (if the electrode pads 12 that extend from the element region 16 do not lie directly over the element region 16).

The manufacturing process for the dice crack detection diffusion layer 30 of the present invention is identical to the conventional diffusion layer manufacturing process, and thus no detailed explanation will be made of the manufacturing process.

The fabrication can be through thermal diffusion after doping, into the desired regions of the semiconductor substrate 11, ions of the type that is different from the conduction type of the semiconductor substrate 11.

Generally, the region that is occupied by the diffusion layer that is fabricated is dependent on the manufacturing process rule. The dice crack detection interconnection 20 and the dice crack detection diffusion layer 30 according to the present invention are, preferably, fabricated using the smallest manufacturing process rules that can be applied, doing so in order to detect the occurrence of dice cracks with precision and to increase yields.

The diffusion layer is produced by a process of doping with the aforementioned ions and of thermal diffusion, and thus the width of the region occupied by the diffusion layer is somewhat larger than the width of the interconnections.

According to the present invention, the dice crack detection interconnections 20 and the dice crack detection diffusion layer 30 are fabricated in the vicinity of the boundary surface with the element region 16 in the field region 44 described above, and thus, when fabricating the dice crack detection diffusion region 30, it is necessary, in particular, to take into consideration the diffusion of the ions and to provide somewhat of a margin in a design so that the diffusion layer 30 is independent of and separate from the element region 16.

Furthermore, the diffusion layer 30 is, preferably, connected to detection terminals 14.

When determining the layout in the semiconductor chip 10 of the dice crack detection diffusion layer 30 according to the present invention, the active region 16 can be designed after establishing the layout and positioning of the dice crack detection diffusion layer 30, or the layout of the dice crack detection diffusion layer 30 can be established following the element region 16 after it has been determined.

Of the diffusion layers that are fabricated in the element region 16 of the semiconductor chip 10, not shown, the dice crack detection diffusion layer 30 according to the present invention can use those diffusion layers that exist in favorable positions for detecting the dice cracks, on the condition that such use does not, for example, cause a loss in functionality of the semiconductor chip 10.

The structure of the semiconductor chip 10 according to this embodiment makes it possible to detect efficiently dice cracks that occur in, and extend from, the bottom surface of the semiconductor chip 10.

In general, the electrical resistance of the diffusion layer is about 10 times larger than that of a metal interconnection layer. Consequently, by using a diffusion layer in the dice crack detection, it is possible to detect dice cracks with greater precision.

In this embodiment, an example was described wherein the diffusion layer was established as the dice crack detection interconnection under the field region 44 in the semiconductor chip 10; however, as in the first embodiment, the dice crack detection interconnection can also be fabricated as a metal interconnection.

Third Embodiment

A semiconductor chip structure according to a third embodiment, and according to an example of a modification thereto, will be explained in relation to FIGS. 3A, 3B, 4A, and 4B.

Figure 3A:
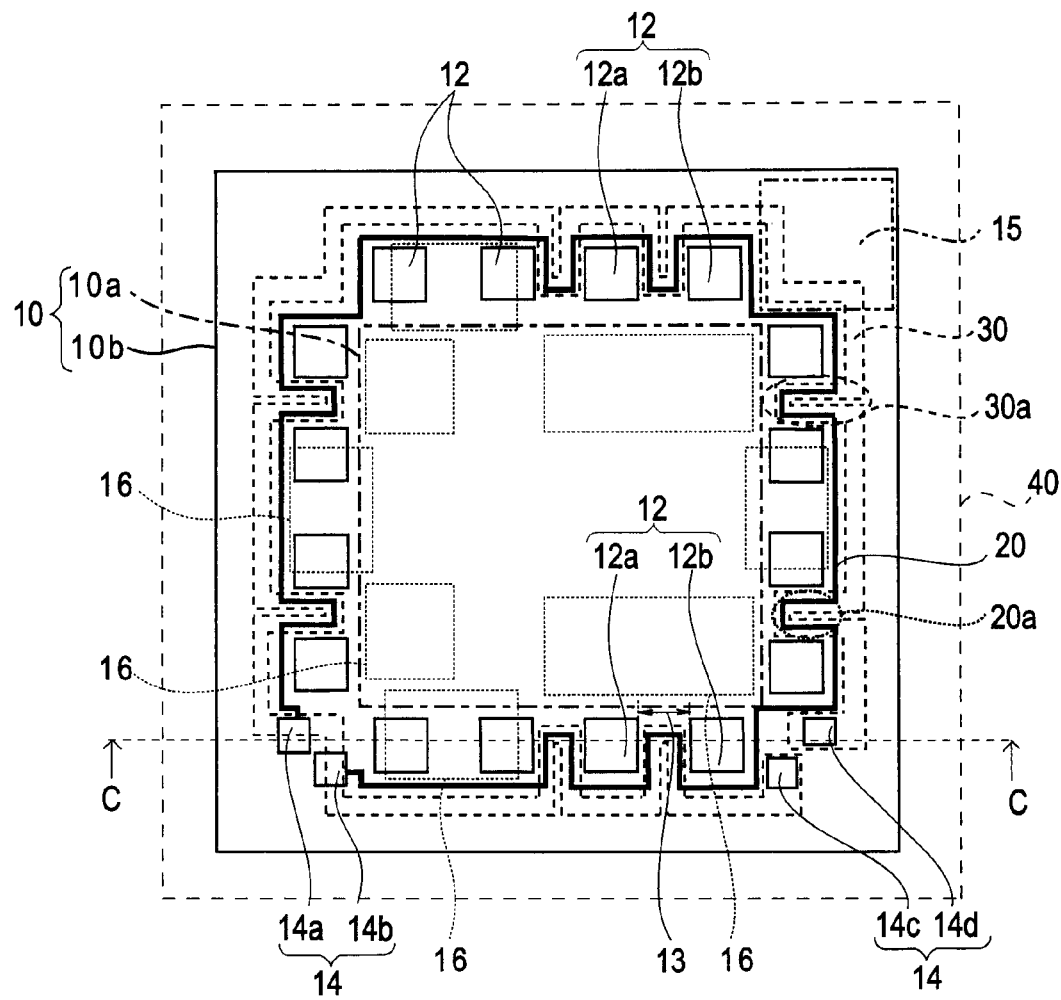
FIG. 3A and FIG. 3B are a schematic top view of a semiconductor device equipped with both a dice crack detection interconnection and a dice crack detection diffusion layer in a third embodiment of the present invention, and a schematic cross-sectional drawing showing a cross-section along the dotted line C—C.
Figure 3B:
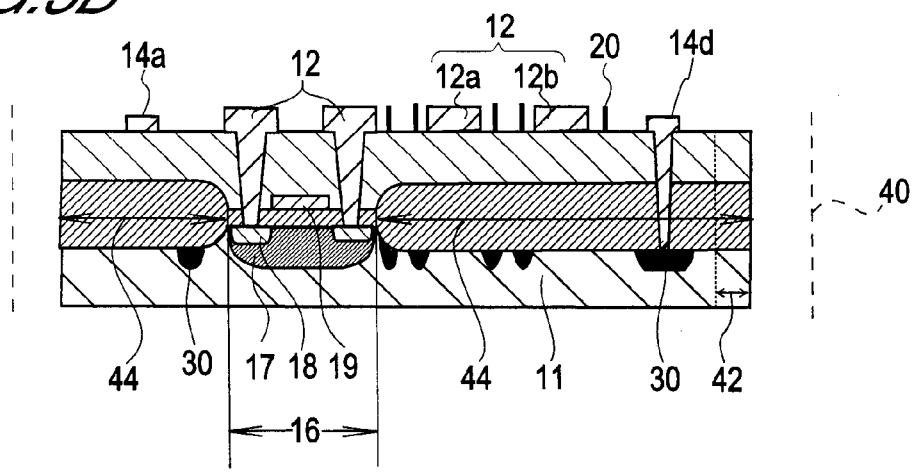

FIG. 3A and FIG. 3B are a planar view showing schematically a semiconductor chip structure according to a third embodiment, and a schematic cross-sectional drawing showing a cross-section along the dotted line C—C.

The semiconductor chip 10 according to this third embodiment is equipped with a first dice crack detection interconnection above the field region or the field oxide layer 44, when viewed in a planar fashion from above the semiconductor chip 10. In addition, the semiconductor chip 10 is equipped with a second dice crack detection interconnection in the field region or preferably on the bottom surface of the field oxide layer 44. This first dice crack detection interconnection is structured the same as a dice crack detection interconnection 20 explained in the first embodiment. Additionally, the second dice crack detection interconnection is structure the same as the dice crack detection diffusion layer 30 in the second embodiment.

Consequently, detailed explanations of the materials, layout design, manufacturing processes, and the like for the dice crack detection interconnection 20 and the dice crack detection diffusion layer 30 in this third embodiment are omitted because they are the same as in the first embodiment and the second embodiment, and the connections between the dice crack detection interconnection 20, the dice crack detection diffusion layer 30, and the monitor terminals, unique to the third embodiment, will be explained in relation to FIG. 3A, FIG. 3B, FIG. 4A, and FIG. 4B.

FIG. 3A and FIG. 3B are, respectively, a schematic planar view and a schematic cross-sectional diagram similar to FIG. 2A and FIG. 2B, respectively.

Both ends of the dice crack detection interconnection 20 and both ends of the dice crack detection diffusion layer 30 in this embodiment are each connected independently to pairs of respectively differing detection terminals. Specifically, the both ends are connected to the pair comprising the first detection electrode pad 14a and the second detection electrode pad 14b, respectively, and to the pair comprising the third detection electrode pad 14c and the fourth detection electrode pad 14d, respectively.

When detecting dice cracks, the respective pairs of detection terminals are measured separately in parallel with the electrical characteristic testing described above.

The dice crack detection is preferably done in conjunction with the electrical characteristic testing of the semiconductor device by measuring the impedance of each of the detection terminal pairs after the semiconductor device assembly process.

This structure makes it possible to detect efficiently and with precision dice cracks that occur in, and extend from, the top surface of the semiconductor chip and cause a loss of functionality of the semiconductor chip, and/or dice cracks that occur on, and extend from, the bottom surface of the semiconductor chip and cause a loss of functionality of the semiconductor chip.

Figure 4A:
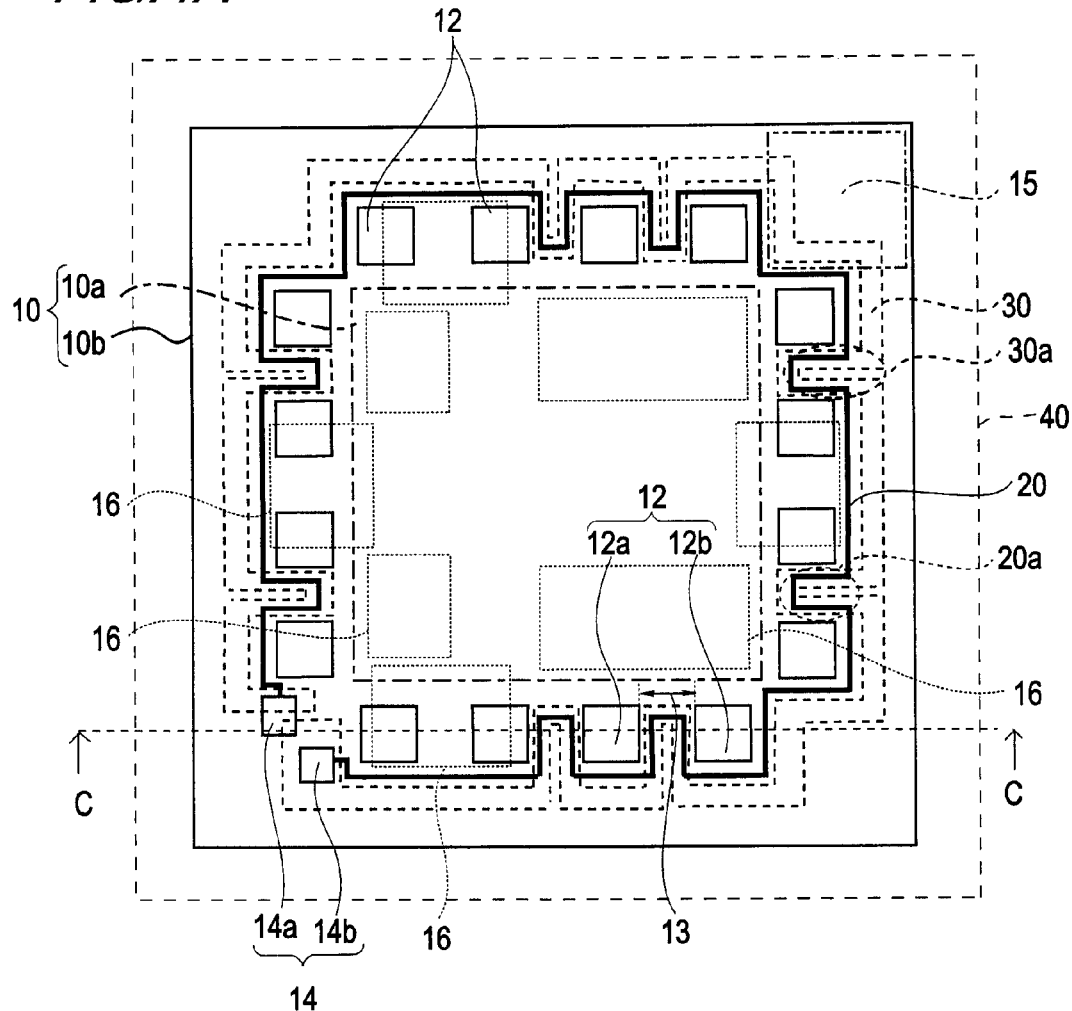
FIG. 4A and FIG. 4B are a schematic top view of a semiconductor device equipped with a dice crack detection interconnection and a dice crack detection diffusion layer that are connected differently in the third embodiment of the present invention, and a schematic cross-sectional drawing showing a cross-section along the dotted line C—C.
Figure 4B:
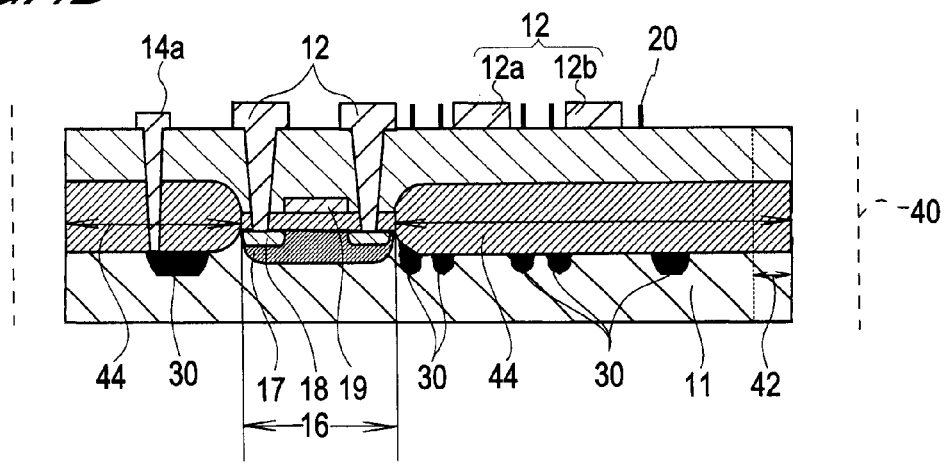

FIG. 4A and FIG. 4B are drawings showing an example of a modification of the third embodiment. Similar to FIG. 3A and FIG. 3B, respectively, they are a schematic planar view and a schematic cross-sectional drawing.

In this embodiment, the dice crack detection interconnection 20 and the dice crack detection diffusion layer 30 are connected jointly to the pair of monitor terminals, respectively, or to a first detection electrode pad 14a and a second detection electrode pad 14b, respectively. This means that the dice crack detection interconnection 20 and the dice crack detection diffusion layer 30 are electrically connected.

The detailed explanations of the materials, layout design, and manufacturing methods, and the like, for the dice crack detection interconnection 20 and the dice crack detection diffusion layer 30 in this modified example are the same as described above, and are thus omitted.

In this embodiment, the following four patterns can be considered to the impedance detected by the pair of detection terminals. In other words, these four patterns are:
1. No disconnects in either the interconnection 20 or the diffusion layer 30 (I1);
2. A disconnect in the interconnection 20 alone (I2);
3. A disconnect in the diffusion layer 30 alone (I3); or
4. A disconnect in both the interconnection 20 and the diffusion layer 30 (I4).

When the magnitude of the impedances of these four different patterns are detected, the magnitudes have the relationships of I4<I2<I3<I1.

Although there will be variability due to the specifications and the like of the semiconductor chips manufactured, the specific impedance values of each of the four patterns will have similar trends, and thus it is possible to differentiate the states of the semiconductor devices in terms of the four individual patterns described above using the inspection equipment that is used for electrical characteristic tests as described above.

The structure of the modified example of this third embodiment makes it possible to use a single measurement to detect both those dice cracks that occur in, and extend from, the top surface of the semiconductor chip and cause a loss of functionality in the semiconductor chip, and those dice cracks that occur on, and extend from, the bottom surface of the semiconductor ship and that cause a loss of functionality in the semiconductor chip, doing so simultaneously and with high efficiency.

What is claimed is:

1. A semiconductor device comprising;
   a semiconductor chip that has a central region, a peripheral region encompassing said central region, a plurality of active regions fabricated in said central region and said peripheral region, and a field region encompassing said active regions;
   a plurality of electrode pads fabricated in said peripheral region;
   a first die crack detection interconnection for detecting die cracks, that is fabricated in said peripheral region so as to surround said central region, and fabricated above said field region in the vicinity of a boundary surface or interface between said active region and said field region; and
   a second die crack detection interconnection for detecting die cracks, that is fabricated in said peripheral region so as to surround said central region, and fabricated under said field region in the vicinity of the boundary surface between said active region and said field region.

2. The semiconductor device according claim 1, wherein said first die crack detection interconnection has a first part fabricated above said field region positioned between said electrode pads.

3. The semiconductor device according to claim 2, wherein said first die crack detection interconnection is fabricated along the edges of said electrode pads.

4. The semiconductor device according to claim 1, wherein said second die crack detection interconnection has a second part that is fabricated under said field region positioned between said electrode pads.

5. The semiconductor device according to claim 4, wherein said second die crack detection interconnection is fabricated along the edges of said electrode pads.

6. The semiconductor device according to claim 1, wherein said first die crack detection interconnection is a metal interconnection.

7. The semiconductor device according to claim 6, wherein said first die crack detection interconnection is fabricated in the same layer as said electrode pads.

8. The semiconductor device according to claim 1, wherein said rack detection interconnection is a diffusion layer.

9. The semiconductor device according to claim 1, wherein said first die crack detection interconnection and said second die crack detection interconnection are connected electrically to each other.

* * * * *